US009578217B2

(12) United States Patent  
Gutierrez et al.

(10) Patent No.: US 9,578,217 B2  
(45) Date of Patent: Feb. 21, 2017

(54) MOVING IMAGE SENSOR PACKAGE

(71) Applicant: MEMS DRIVE, INC., Arcadia, CA (US)

(72) Inventors: Roman Gutierrez, Arcadia, CA (US); Guiqin Wang, Arcadia, CA (US); Xiaolei Liu, South Pasadena, CA (US)

(73) Assignee: MEMS Drive, Inc., Pasadena, CA (US)

( * ) Notice: Subject to any disclaimer, the term of this patent is extended or adjusted under 35 U.S.C. 154(b) by 40 days.

(21) Appl. No.: 14/692,662

(22) Filed: Apr. 21, 2015

(65) Prior Publication Data

US 2015/0350500 A1 Dec. 3, 2015

Related U.S. Application Data

(60) Provisional application No. 62/003,421, filed on May 27, 2014.

(51) Int. Cl.
*H04N 5/228* (2006.01)
*H04N 5/225* (2006.01)
*H05K 1/18* (2006.01)

(52) U.S. Cl.
CPC .......... *H04N 5/2253* (2013.01); *H05K 1/182* (2013.01); *H05K 2201/10083* (2013.01); *H05K 2201/10121* (2013.01); *Y10T 29/4913* (2015.01)

(58) Field of Classification Search
CPC ................. H04N 5/2253; H05K 1/182; H05K 2201/10121; H05K 2201/10083; Y10T 29/4913
USPC .............................. 348/222.1, 771, 373–376
See application file for complete search history.

(56) References Cited

U.S. PATENT DOCUMENTS

| 9,164,262 B2* | 10/2015 | Chen | G02B 13/143 |
| 2010/0066393 A1* | 3/2010 | Bottoms | G01R 1/06711 |
| | | | 324/755.05 |
| 2013/0202245 A1* | 8/2013 | Sakurai | G02F 1/3534 |
| | | | 385/7 |

* cited by examiner

*Primary Examiner* — Yogesh Aggarwal
(74) *Attorney, Agent, or Firm* — Brian J. Colandreo; Michael T. Abramson; Holland & Knight LLP

(57) ABSTRACT

A moving image sensor package is provided that may be used to provide optical image stabilization (OIS) in the same form factor as non-OIS enabled image sensors utilized in portable/mobile devices. The moving image sensor package includes an image sensor attached to a MEMS actuator mounted within a cutout in a circuit board, wherein the MEMS actuator has substantially the same thickness as the circuit board.

19 Claims, 16 Drawing Sheets

MOVING IMAGE SENSOR PACKAGE

CROSS-REFERENCE TO RELATED APPLICATIONS

This application claims the benefit of U.S. Provisional Application No. 62/003,421 filed May 27, 2014, and which is hereby incorporated herein by reference in its entirety.

TECHNICAL FIELD

The disclosed technology relates generally to image sensor packaging, and more particularly, some embodiments relate to image sensor packaging incorporating a microelectromechanical systems (MEMS) actuator for optical image stabilization (OIS).

DESCRIPTION OF THE RELATED ART

Optical image stabilization (OIS) is the process of adjusting for motion of a camera during operation to reduce blurring in captured images. OIS actuators can be used in miniature cameras that may be implemented in portable electronic devices, such as mobile phones, to adjust for motion of the electronic device while capturing images. Such OIS actuators can comprise voice coil motors (VCMs) that are used to move a lens barrel to achieve OIS functionality. These VCM actuators, however, are ill suited for today's mobile technology. Mobile electronic devices are providing greater capabilities within the same size device, limiting the amount of space available for additional components. VCM actuators require a certain amount of space to function and are not easily miniaturized. In addition, VCM actuators alone lack the precision necessary for OIS, requiring additional position sensors to be included in the device. Use of VCM actuators for OIS in mobile devices requires redesigning the camera cavity, requiring a design to weigh trade-offs with other capabilities. Furthermore, VCM actuators work by flowing current through a coil, and consume excessive electrical power. The excessive power consumption leads to reduced battery lifetime and increased heat, which degrades image quality. This could present issues, especially in the context of portable/mobile devices that operate using limited battery power sources.

Some stand-alone cameras utilize OIS actuators that move the entire image sensor package. Several actuators within the camera move the image sensor package to account for unwanted motion during exposure. However, traditional OIS actuators for moving the entire image sensor package require a large amount of force to operate, especially when scaled for use in a miniature camera. In addition, the multiple actuators required still require additional space within the camera, similar to the VCM actuators described above, resulting in the same issue of size for small form factor devices, like mobile devices.

BRIEF SUMMARY OF EMBODIMENTS

According to various embodiments of the disclosed technology, a moving image sensor package for use in miniature devices is provided. The moving image sensor package utilizes a MEMS actuator capable of providing three degrees of freedom to allow for improved optical image stabilization in miniature devices, such as mobile phones. The moving image sensor package in accordance with the technology here disclosed does not consume excess power and without requiring increased dimensions in either the x-, y-, or z-plane. Moreover, the moving image sensor package is designed to provide additional features, such as shock correction and heat dissipation.

According to an embodiment of the disclosed technology, an image sensor package is provided, comprising an image sensor; a circuit board comprising a cutout; a MEMS actuator having substantially the same thickness as the circuit board and configured to fit within the cutout; a back plate; and a cap comprising a window.

According to an embodiment of the disclosed technology, a camera in a portable electronic device is provided, comprising an image sensor; a MEMS actuator for moving the image sensor; a circuit board; and a back plate and a cap that are configured to attach onto the circuit board and encapsulate the MEMS actuator and the image sensor.

According to an embodiment of the disclosed technology, a method of packaging an image sensor is provided, comprising providing a circuit board with a cutout; attaching a MEMS actuator such that it fits substantially within the cutout of the circuit board; and attaching an image sensor onto a moving portion of the MEMS actuator.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

Some of the figures included herein illustrate various embodiments of the disclosed technology from different viewing angles. Although the accompanying descriptive text may refer to such views as "top," "bottom" or "side" views, such references are merely descriptive and do not imply or require that the disclosed technology be implemented or used in a particular spatial orientation unless explicitly stated otherwise.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Various embodiments of the technology disclosed herein are directed toward image sensor packaging for providing OIS within miniature devices. More particularly, the various embodiments of the technology disclosed herein relate to image sensor packaging incorporating a MEMS actuator that achieves full-size camera quality OIS within miniature devices. Some non-limiting examples of devices within which the image sensor packaging in accordance with the technology disclosed herein may be implemented include portable electronic devices, miniature cameras, optical telecommunications components, and medical instruments. Other small-form factor devices are also contemplated by the present disclosure, and the preceding list should not be read to limit the scope of the present disclosure. In addition, various embodiments are directed towards a method of manufacturing the image sensor packaging incorporating a MEMS actuator.

Figure 1A:
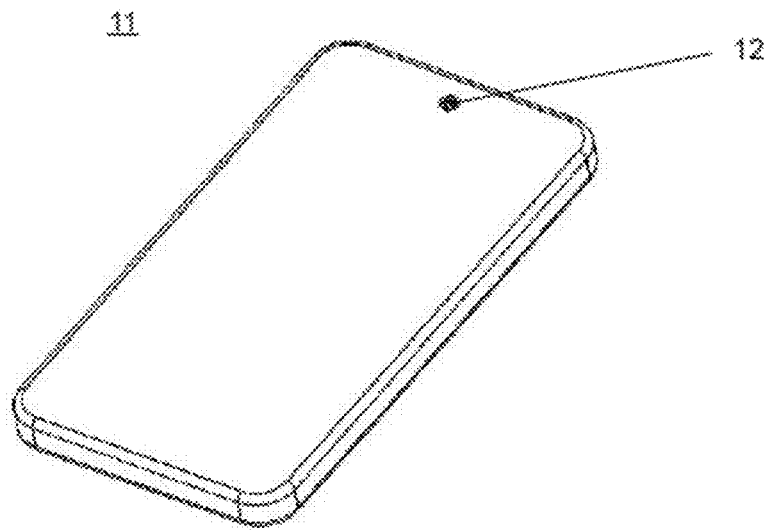
FIG. 1A is a perspective view of an example embodiment of a cell phone in accordance with the technology disclosed herein.
Figure 1B:
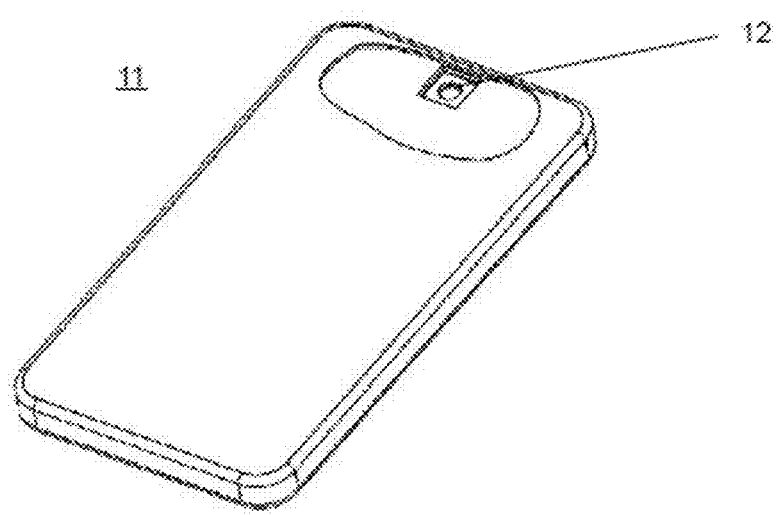
FIG. 1B is a breakout perspective view of an example embodiment of a miniature camera in accordance with the technology disclosed herein.

As stated above, one example device within which the technology of the present disclosure may be implemented is a mobile phone. FIG. 1A shows a perspective view of a mobile phone 11 containing a miniature camera 12 that employs a moving image sensor package according to the technology disclosed herein. As shown in FIG. 1A, the thickness of the miniature camera 12 is less than the thickness of the mobile phone 11, allowing the miniature camera 12 to fit inside the camera cavity of the mobile phone 11. In addition, the other dimensions of the miniature camera 12 are small enough to allow other components to fit inside the mobile phone enclosure. In various embodiments, the miniature camera 12 may be sized similarly to a miniature camera employing a conventional image sensor packaging where the image sensor is not moving. In this way, a miniature camera in accordance with the present disclosure may be used to add OIS capability to mobile phones designed to include the traditional, non-moving image sensor packaging. The fit of the miniature camera 12 within the mobile phone 11 is shown in more detail in FIG. 1B. The miniature camera 12 illustrated in FIGS. 1A and 1B may achieve functionality related to moving the image sensor, such as optical image stabilization (OIS), automatic focusing (AF), alignment between lens and image sensor, and the like.

Figure 2A:
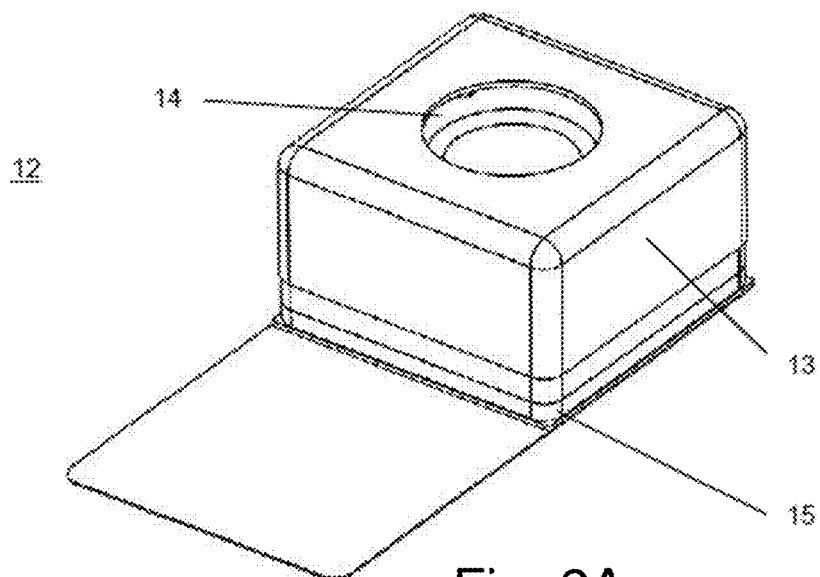
FIGS. 2A and 2B are perspective views of an example embodiment of a miniature camera in accordance with the technology disclosed herein.

FIG. 2A shows a perspective view of an example miniature camera 12 with a moving image sensor package in accordance with the technology disclosed herein. In FIG. 2A, the miniature camera 12 comprises an electromagnetic interference (EMI) shield 13, a lens barrel 14, and a moving image sensor package 15. In other embodiments, additional components may be included, such as an autofocus (AF) actuator. The lens barrel 14 may be aligned and mounted to the moving image sensor package 15 using commercial active alignment equipment. In various embodiments, the EMI shield 13 may be attached to the lens barrel 14 prior to mounting the lens barrel 14 to the moving image sensor package 15, or after the lens barrel 14 is mounted.

During camera module design and manufacturing, the lens barrel 14 may be modified to achieve a desired optical performance, such as but not limited to: field of view; optical transfer function; stray light; ghosting; chromatic aberration; distortion; and focusing range. During camera module design and manufacturing, the lens barrel 14 may be modified to achieve a desired mechanical performance, such as but not limited to: thickness; width; and shape. The aforementioned lens barrel modifications may be made substantially independent of the moving image sensor package 15. Conversely, changes may be made to the moving image sensor package 15 substantially independent of the lens barrel 14.

Figure 2B:
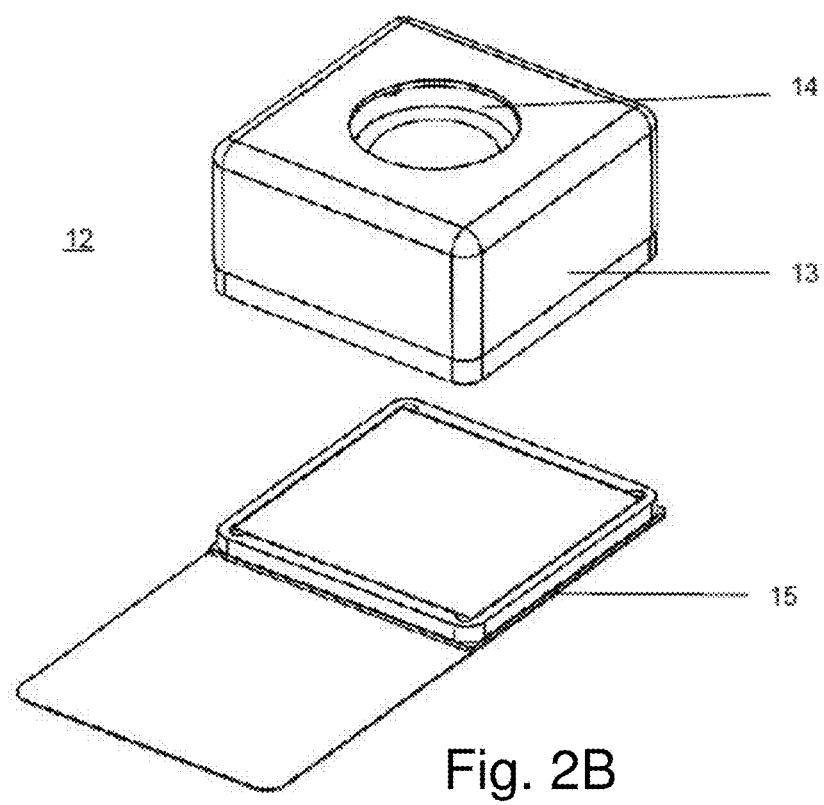

FIG. 2B shows a partially exploded view of the example miniature camera 12 with a moving image sensor package 15 of FIG. 2A to identify more clearly the different components. The EMI shield 13 is shown attached to the lens barrel 14 and separated from the moving image sensor package 15. In various embodiments, the moving image sensor package 15 is sized similarly to a conventional image sensor package where the image sensor is not moving. Thus, moving image sensor package 15 (as well as the miniature camera 12 in which it may be implemented) can be incorporated into portable electronic devices without requiring an increase in the size or footprint of the portable electronic devices.

Figure 3A:
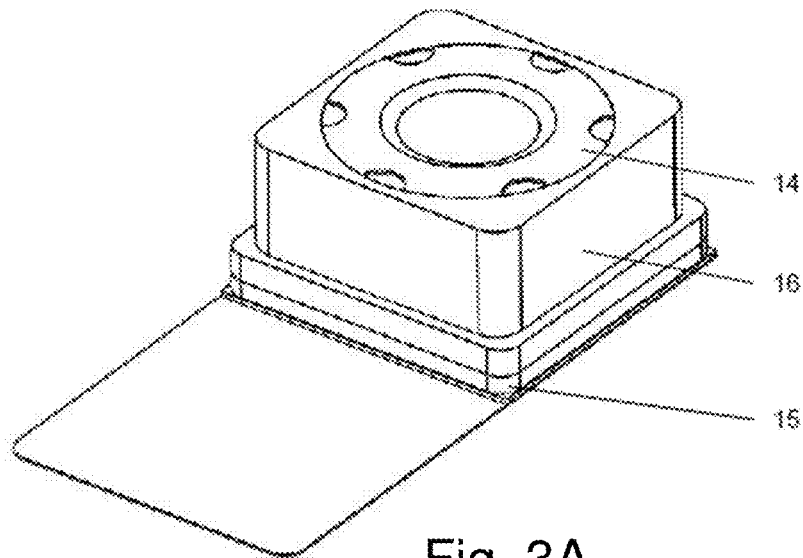
FIG. 3A is a perspective view of an example embodiment of a miniature camera in accordance with the technology disclosed herein.

FIG. 3A shows a perspective view of another example miniature camera in accordance with the technology disclosed herein. As illustrated in FIG. 3A, some embodiments of the technology disclosed herein may be implemented without an EMI shield, e.g., the shielding may either be removed or omitted entirely from the design of the miniature camera.

Figure 3B:
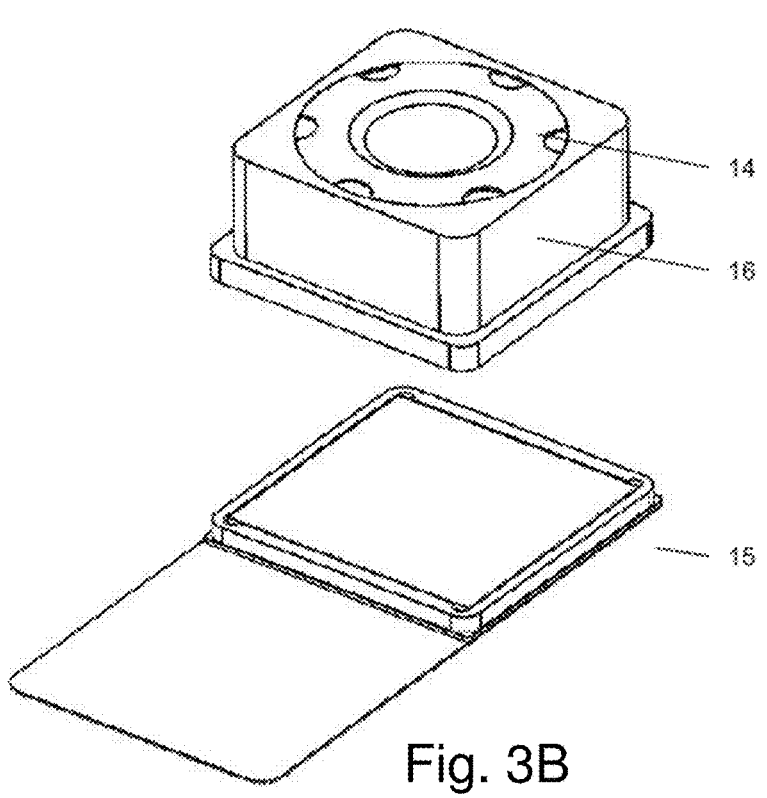
FIG. 3B is an exploded perspective view of an example embodiment of a miniature camera without EMI shielding in accordance with the technology disclosed herein.

The miniature camera 12 illustrated in FIG. 3A includes a lens barrel 14, an autofocus (AF) actuator 16, and a moving image sensor package 15. In various embodiments, the AF actuator 16 may be a VCM type of actuator, a MEMS actuator, a piezoelectric actuator, a shape memory alloy actuator, or any other type of actuator suitable for autofocusing. Similar to the design of the lens barrel, the AF actuator 16 may be designed independent of the moving image sensor package 15, allowing for greater flexibility in design of the miniature camera. In various embodiments, the AF actuator 16 may electrically connect to the moving image sensor package 15. FIG. 3B shows a partially exploded view of the miniature camera 12 of FIG. 3A. As illustrated in FIG. 3B, the lens barrel 14 is shown as being attached to the AF actuator 16 and separated from the moving image sensor package 15.

Figure 4:
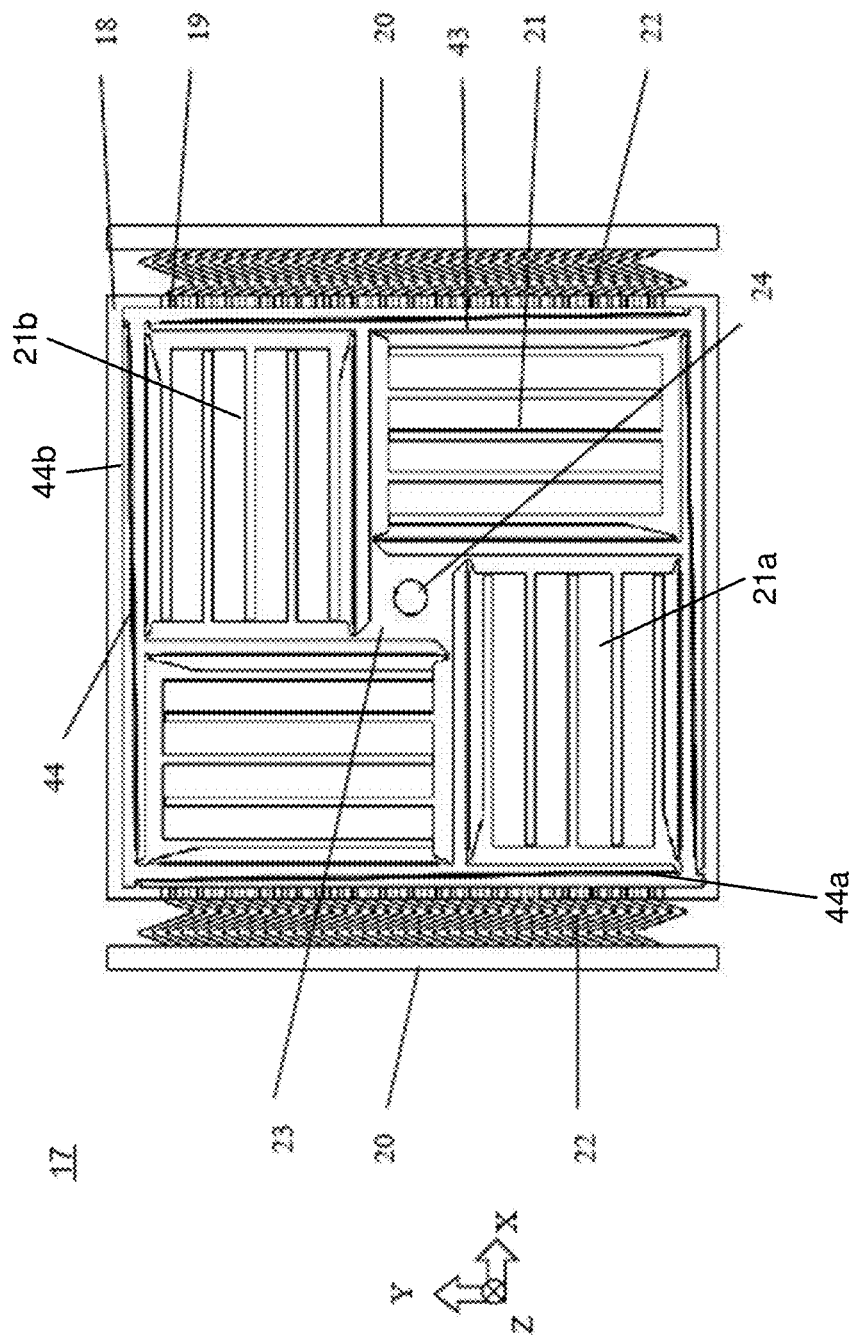
FIG. 4 is a top plan view of an example embodiment of a MEMS actuator in accordance with the technology disclosed herein.

By using a MEMS actuator instead of the traditional VCM actuators, the technology of the present disclosure achieves high-quality OIS capability within the same form factor as non-OIS capable image sensor packages. FIG. 4 shows a two dimensional plan view of an example MEMS actuator 17 in accordance with the technology disclosed herein. The MEMS actuator 17 moves the image sensor inside the moving image sensor package to account for motion during exposure. In various embodiments, the MEMS actuator 17 is designed to move the image sensor in three degrees of freedom to provide not only horizontal and vertical correction, but also rotational correction as well. Example MEMS actuators suitable for moving an image sensor are described in U.S. Provisional Patent Application No. 61/975,617 by Roman Gutierrez, entitled "Multiple Degree of Freedom Actuator", incorporated herein by reference in its entirety.

In some embodiments, the MEMS actuator 17 comprises a middle frame 18 with contact pads 19, an outer frame separated into two electrical bars 20, four actuation areas 21, a central anchor 23 with a glue hole 24, and a plurality of electrical connection flexures 22. The number of glue holes 24 is not limited to one; there may be multiple holes depending on the electrical connection requirement. In various embodiments, the glue hole 24 enables a structural bond to mount the MEMS actuator to a carrier substrate by applying an epoxy through the glue hole 24. In some embodiments, the glue hole 24 can enable an electrical connection from the MEMS actuator to a conductive trace or substrate by using a conductive epoxy, solder, metal pastes, or other electrical connector. The outer electrical bars 20 provide connections between the MEMS actuator 17 and the rest of the moving image sensor package. The contact pads 19 on the middle frame 18 provide electrical connections between the image sensor (not shown) and the MEMS actuator 17. In some embodiments, each actuation area 21 may contain electrostatic comb drives and provides force in one linear direction. The four actuation areas 21 together provide movement in the X and Y directions, and rotation about the Z axis. In this way, the MEMS actuator 17 moves in two linear degrees of freedom and one rotational degree of freedom to achieve optical image stabilization of the miniature camera in all three rotational degrees of freedom. The actuation areas 21 are connected to the central anchor 23 through parallel motion control flexures 43 and to the middle frame 18 through connection flexures 44 that are stiff in the motion degree of freedom and soft in other degrees of freedom. For example, if actuation areas 21a and 21b rotate in the same Y direction, the connection flexures 44a and 44b remain stiff, causing the middle frame 18 to move in the same Y direction. When actuation areas 21c and 21d move in the same X direction, the connection flexures 44a and 44b are soft, flexing in the same direction. In various embodiments, the actuation areas 21 include features that limit mechanical movement during drop or shock to reduce the stress on the parallel motion control flexures 43 and the connection flexures 44

In various embodiments, the image sensor may be attached to the outer frame 20 and the central anchor 23, while the middle frame 18 may be attached to the circuit board of the moving image sensor package. In some embodiments, the image sensor is attached to the inner frame 18 and the central anchor 23. In some embodiments, the X/Y dimension of the MEMS actuator 17 is related to the image sensor size. In some embodiments, the outline dimensions of the middle frame 18 substantially match the size of the image sensor. In other embodiments, the outline dimensions of the outer frame 20 substantially match the size of the image sensor. In various embodiments, the thickness of the MEMS actuator 17 is around 150 micrometers and the in-plane dimensions are about 8 mm along the X axis by 6 mm along the Y axis.

Figure 5:
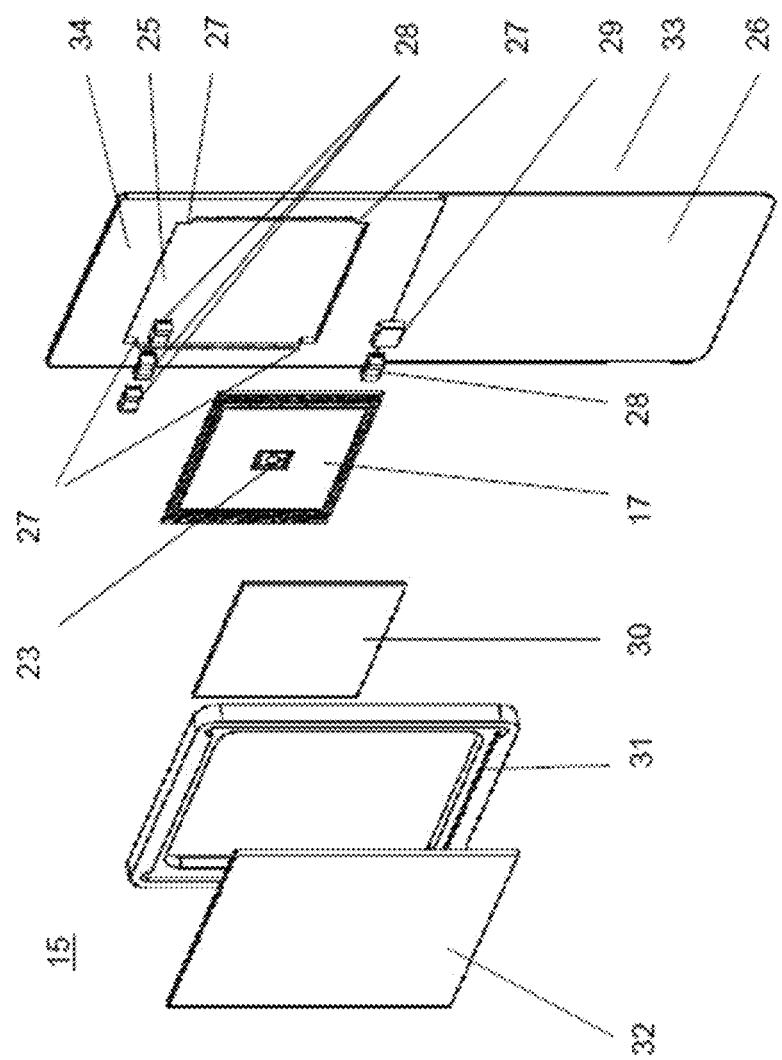
FIG. 5 is an exploded perspective view of an example embodiment of an image sensor package in accordance with the technology disclosed herein.

FIG. 5 is an exploded perspective view of a moving image sensor package 15 in accordance with an example embodiment of the technology disclosed herein. Moving image sensor package 15 may include, but not necessarily limited to, the following: a substrate 33; a plurality of capacitors or other passive electrical components 28; a MEMS actuator driver 29; a MEMS actuator 17; an image sensor 30; an image sensor cap 31; and an infrared (IR) cut filter 32. In various embodiments, the substrate 33 may include a rigid circuit board 34 with an opening 25 and in-plane movement limiting features 27, and a flexible circuit board as a back plate 26. The rigid circuit board may be made out of ceramic or composite materials, such as those used in the manufacture of printed circuit boards (PCBs). In various embodiments, the moving image sensor package may include one or more MEMS actuator drivers 29, depending on the requirements of the MEMS actuator utilized. In various embodiments, the shape of opening 25 is designed to fit the MEMS actuator 17, and may provide in-plane movement limiting features 27 on the corners if needed to improve the in-plane drop performance. The size of opening 25 may be adjusted based on the size of the image sensor 30. In some embodiments, the back plate 26 may include embedded copper traces and features, which, besides routing electrical signals, may also function as a spacer to control the z-gap between the back plate 26 and the MEMS actuator 17. Thermal conduction of air is roughly inversely proportional to the size of the z-gap. By controlling the space between the back plate 26 and the MEMS actuator 17, greater thermal dissipation is possible without the need for additional heat sink components to be included. In various embodiments, the gaps between the image sensor 30 and the stationary portions of the MEMS actuator 17, and between the moving portions of the MEMS actuator 17 and the back plate 26, can be maintained at a distance less than about 50 micrometers, to allow for dissipation of substantial amount of power between 100 mW and 1 W. In some embodiments, the back plate 26 is substantially made out of a material with good thermal conduction, such as copper, to improve further the heat sinking of the image sensor 30. In various embodiments, the back plate 26 has a thickness of approximately 50 to 100 micrometers, and the rigid circuit board 34 has a thickness around 150 to 200 micrometers. In some embodiments, the central anchor 23 is attached to the back plate 26 by epoxy through the glue hole 24.

Figure 6:
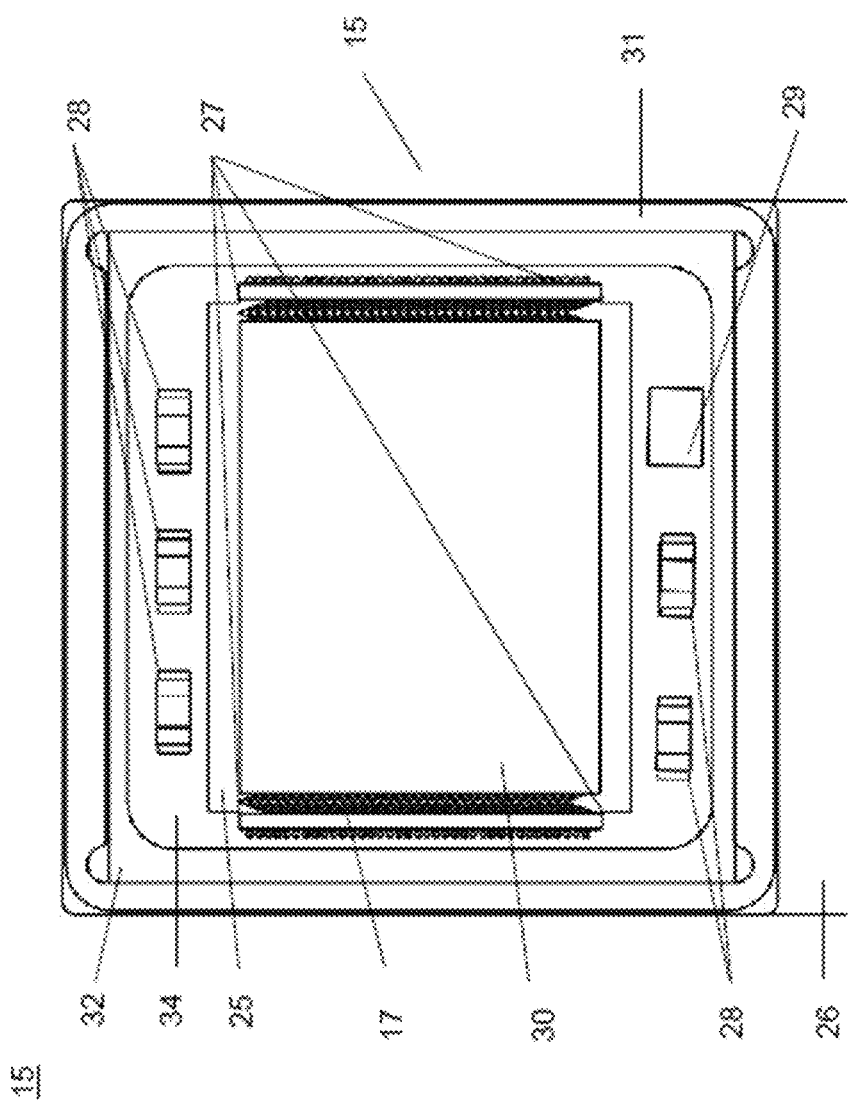
FIG. 6 is a top plan view of an example embodiment of an image sensor package in accordance with the technology disclosed herein.

FIG. 6 shows a top planar view of a moving image sensor package 15 in accordance with an example embodiment of the technology disclosed herein. The window 32 is illustrated in a transparent manner in order to view other components inside the image sensor package 15, including: the image sensor 30; the MEMS actuator 17; the rigid circuit board 34 with opening 25; the back plate 26; the image sensor cap 31; the passive electrical components 28; the drivers 29; and the front window 32. In various embodiments, the MEMS actuator 17 is mounted inside the opening 25 so that its top surface is substantially level with the top surface of the rigid circuit board 34. The image sensor 30 is mounted on top of the MEMS actuator 17, as discussed above in regards to FIG. 4. Because the top surface of the MEMS actuator 17 is substantially level with the top surface of the rigid circuit board 34, there is no added thickness compared to mounting the image sensor on top of a rigid circuit board.

In various embodiments, the passive electrical components 28 may include capacitors, resistors, or a combination thereof needed by the image sensor 30 or the drivers 29. For example, capacitors may be used to filter the noise in the voltage supplies. The passive electrical components 28 may be mounted on top of the rigid circuit board as shown, embedded inside the rigid circuit board, or mounted on the MEMS actuator surface or image sensor surface.

The back plate 26 may be a flexible circuit that provides backing to the MEMS actuator 17 and a flexible connection to take up tolerances in mounting the camera. In some embodiments, the back plate 26 includes a thin metal plate, such as a 50-micrometer thick steel plate, that is bonded behind the rigid circuit board 34 and provides rigidity to the moving image sensor package. In one embodiment, the back plate 26 includes a film of thermally conductive material, such as copper film or carbon film, to dissipate heat from the moving image sensor package 15.

Shock to a portable/mobile electronic device may cause the moving image sensor package to shift, causing alignment and operation issues. In various embodiments, to protect against issues arising from mechanical shock, movement-limiting features 27 may be included in the rigid circuit board 24. In various embodiments, the movement-limiting features 27 may be notches in the rigid circuit board 24 designed to act as a stop against which the moving image sensor package contacts in the event of a jarring shock. The movement-limiting features 27 may be designed with multiple shapes to accommodate different image sensor shapes and designs to limit the in-plane movement of the image sensor during drop or mechanical shock.

Figure 7:
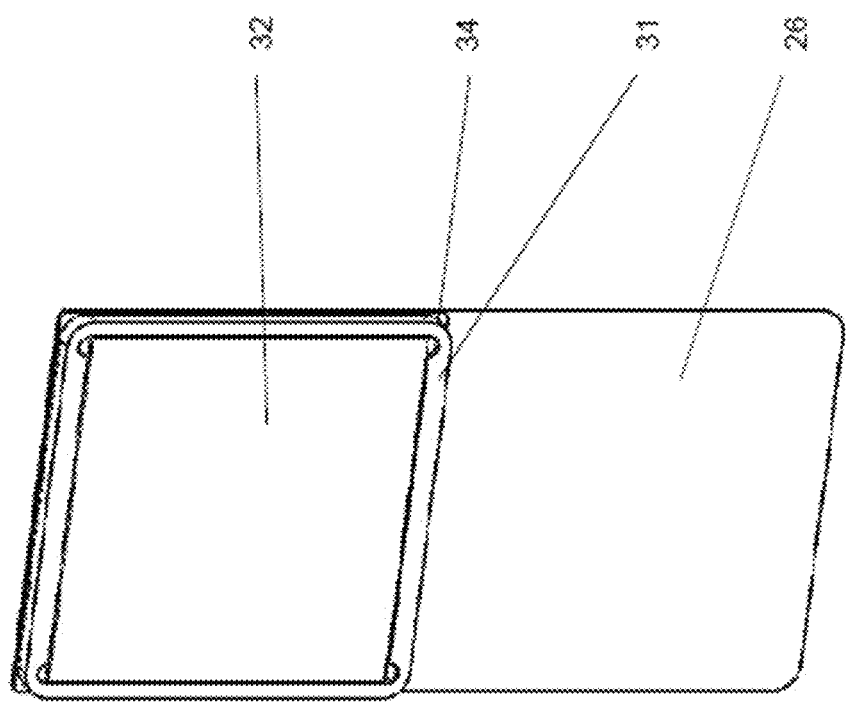
FIG. 7 is a perspective view of an example embodiment of an image sensor package in accordance with the technology disclosed herein.

FIG. 7 shows a perspective view of the moving image sensor package 15 fully constructed in accordance with an example embodiment of the technology disclosed herein. As illustrated in the example embodiment of FIG. 7, the MEMS actuator 17 and the image sensor 30 are encapsulated by the rigid circuit board 34, the back plate 26, the image sensor cap 31, and the window 32. The encapsulation prevents particles and dust from entering the cavity as well as ensuring that light may only enter the cavity through specified locations, such as through the front window 32. All components may be attached and sealed with epoxy, or adhesives. In various embodiments, the seal may be hermetic, meaning no significant amount of gas or liquids can enter or exit the cavity by, for example, using a ceramic rigid circuit board 34, a metal back plate 26, a metal image sensor cap 31, and a glass window 32 all bonded together using metal to glass bonding, metal to metal bonding, metal solders, or any other type of bonding technique. In some embodiments, there is a hole in one of the components to allow the pressure inside the package to equalize with the pressure outside of the package.

Figure 8:
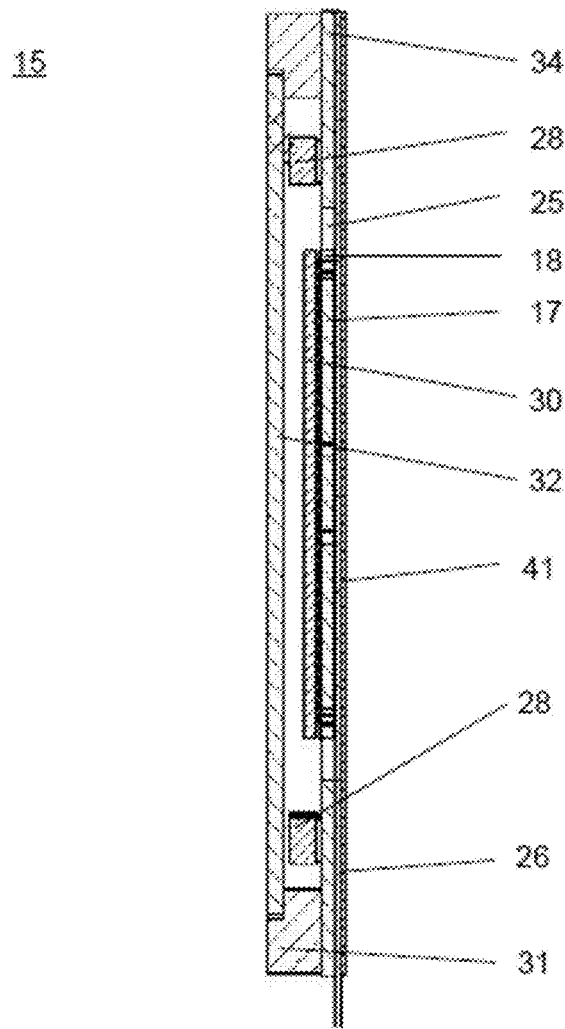
FIG. 8 is a cross-section view of an example embodiment of an image sensor package in accordance with the technology disclosed herein.

FIG. 8 shows a cross-sectional view of moving image sensor package 15 in accordance with an example embodiment of the technology disclosed herein. As illustrated in FIG. 8, the MEMS actuator 17 fits substantially inside the opening 25 of the rigid circuit board 34. In some embodiments, the MEMS actuator 17 is about 150 micrometers thick. In some embodiments, the image sensor 30 is electrically connected to the MEMS actuator middle frame 18 through an electrical connection such as conductive epoxy, solder, metal pastes, metal bonding, or nano gold ink. In some embodiments, structural epoxy is used to mechanically strengthen the bond between the image sensor 30 and the middle frame 18.

Embodiments in accordance with the present disclosure allow an automated assembly machine to automatically locate and place the MEMS actuator 17 by features on the rigid circuit board 34 and on the MEMS actuator. The package is sealed by the window 32, the image sensor cap 31, the rigid circuit board 34, and the back plate 26. In some embodiments, the window may contain an IR cut filter. To improve the stiffness of the back plate 26, a metal stiffener 41 may be added on the back in various embodiments. In various embodiments, the thickness of the metal plate 41 may fall within a range from 50 micrometers to 100 micrometers. Embodiments of the technology disclosed herein also function as a heat sink to conduct the heat out of the moving image sensor package. By dissipating the heat, the moving image sensor package can operate more effectively and achieve greater picture quality. In various embodiments, the gap between the image sensor 30 and the MEMS actuator middle frame 18 is around 20 μm; this narrow gap creates a good conductive layer to conduct heat out of the moving image sensor package.

Figure 9:
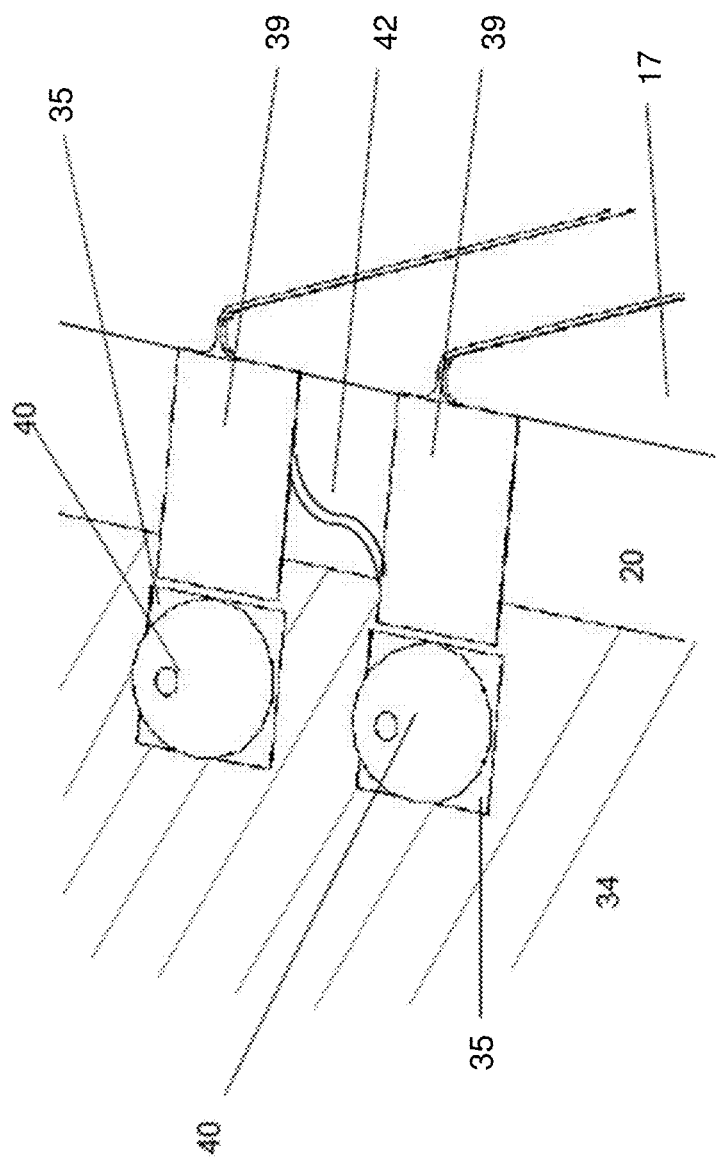
FIG. 9 is a perspective view of an example embodiment of solder balls and electrical connection tabs in accordance with the technology disclosed herein.

The moving image sensor package may employ surface mount technology to allow for the smaller size. FIG. 9 shows a perspective view of solder balls 40 and electrical connection tabs 39 for surface mount technology in accordance with an example embodiment of the technology disclosed herein. In various embodiments, electrical connection tabs 39 extend beyond the edge of the MEMS actuator frame bars 20 to form electrical connections with the rigid circuit board contacts 35. In some embodiments, the electrical connection tabs 39 may extend about 50 to 100 micrometers beyond the edge of the MEMS actuator frame bars 20. In various embodiments, the number of rigid circuit board contacts 35 matches the number of MEMS actuator tabs. In various embodiments, the rigid circuit board contacts 35 may be spaced away from the opening on the rigid circuit board 34 such that solder cannot leak into the opening during the manufacturing process, such as during the solder reflow that is part of the surface mount technology (SMT) process that may be used to mount all components to the rigid circuit board. In some embodiments, the rigid circuit board contacts 35 may be spaced about 50 micrometers away from the opening on the rigid circuit board 34. After all other components are mounted and the populated circuit board is cleaned, the MEMS actuator 17 is placed in the opening, and the part goes through a second SMT reflow process. SMT is a standard process used to form electrical connections between components and a circuit board. In this second reflow, the solder balls 40 flow into the MEMS actuator tabs 39, solidifying again when returning to room temperature.

The solder bridges between the rigid circuit board contacts 35 and the MEMS actuator tabs 39 and forms an electrical contact. In some embodiments, a MEMS flexure 42 may be included in the frame bar 20 to provide flexibility to thermal expansion mismatch during the high temperature reflow process. In various embodiments, the MEMS flexure 42 may be designed with a different shape, position, or configuration. For example, in some embodiments the MEMS flexure 42 could be designed with a single flexure under each electrical connection tab, with a single flexure to the side of each tab, or could have a different quantity independent of the number of tabs and with a different shape designed according to the quantity and location of the MEMS flexures 42. The electrical connection tabs 39 also allow the rigid circuit board 34 and the MEMS actuator frame bar 20 to form electrical connections on the top surface of the MEMS actuator, which is the same surface that faces the electrical contacts on the image sensor 30. The connection process between the electrical connection tabs 39 and the rigid circuit board contacts 35 is not limited to the method illustrated heretofore, and may include using conductive epoxy, wire bonding, or any other method suitable for providing an electrical connection between contact pads on a rigid circuit board and the electrical leads on a component.

Figure 10A:
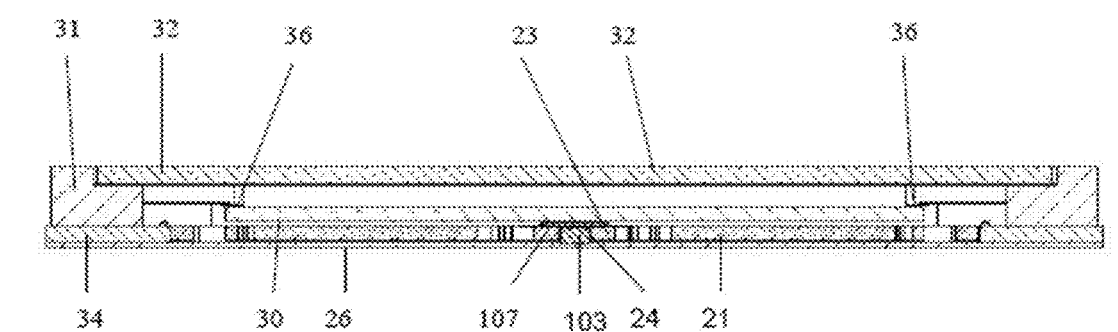
FIG. 10A is a cross-section view of an example embodiment of an image sensor package in accordance with the technology disclosed herein.

In various embodiments, the image sensor cap may include several features to increase the efficiency of the moving image sensor package. FIG. 10A shows a cross-sectional view of a moving image sensor package with shock mitigation features included in the image sensor cap 31 in accordance with an example embodiment of the technology disclosed herein. In various embodiments, the image sensor movement limiting features 36 may be molded in the image sensor cap 31. These features 36 may be located so that they do not block light that passes the window 32 to form an image on the image sensor 30. In various embodiments, the image sensor movement shock mitigation features 36 contact the top surface of the image sensor when a shock causes the image sensor 30 to move towards the window 32, similar to the movement-limiting features discussed above in regards to the rigid circuit board in FIG. 6. In some embodiments, to protect against shocks that move the image sensor 30 away from the window 32, a soft epoxy 107 may be applied on top of the central anchor 23 and cured prior to attaching the image sensor to limit motion and absorb energy from the system. In some embodiments, a structural epoxy 103 may be applied to the back plate 26 that flows through the glue hole 24 and serves to mechanically bond the MEMS actuator central anchor 23 to the back plate 26. As described earlier, the number of holes or notches 24 is not limited, and may also enable an electrical connection to a base substrate such as the back plate 26 by applying conductive epoxy or other conductive material.

Figure 10B:
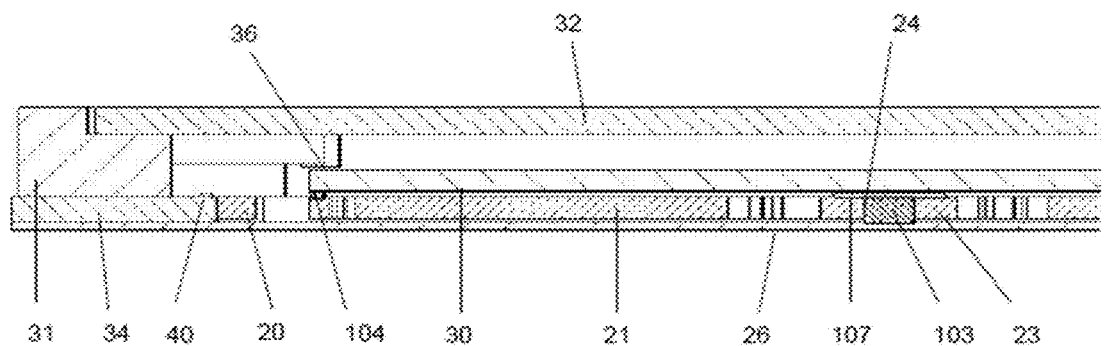
FIG. 10B is a zoomed-in, cross-section view of an example embodiment of an image sensor package in accordance with the technology disclosed herein.

FIG. 10B shows a close-up of the cross-sectional view in FIG. 10A. The zoomed-in FIG. 10B shows the details of the image sensor shock mitigation features 36 on the image sensor cap 31 and the central anchor 23. The image sensor 30 and the MEMS actuator moving portion 21 are connected mechanically and electrically by conductive connector 104. In various embodiments, the conductive connector 104 may include solder bridges, conductive epoxy, wire bonding, or any other method suitable for providing an electrical connection between the image sensor 30 and the MEMS actuator moving portion 21. In various embodiments, the gap between the back plate 26 and the MEMS actuator moving portion 21 is less than 50 micrometers; this limits the movement of the image sensor 30 towards the window 32 during a drop. The image sensor shock mitigation features 36 on the image sensor cap 31 may have a 20 micrometers gap that further limits the movement of the image sensor during a drop. As discussed above, the thin controlled gap between the image sensor 30 and the central anchor ensures good conduction of heat. In some embodiments, the gap between the image sensor 30 and the central anchor 23 is about 20 to 30 micrometers. In addition, the soft glue layer 107 on the top surface of the MEMS actuator fixed portion 23 functions as an additional out of plane movement limiting feature for the image sensor 30.

Figure 11:
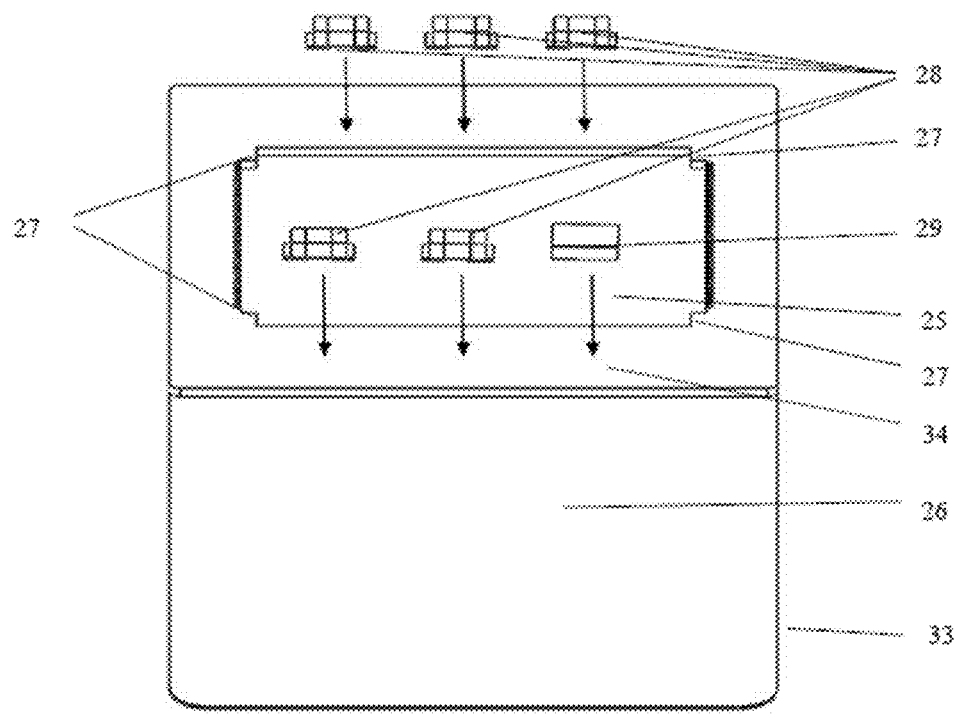
FIGS. 11 and 12 are exploded perspective views illustrating an example assembly process in accordance with the technology disclosed herein.

FIG. 11 shows an exploded perspective view of a placement of the capacitors, drivers, or inertial sensor to rigid circuit board in accordance with an example embodiment of the technology disclosed herein. In various embodiments, the capacitors 28 and the drivers 29 may be mounted on the rigid circuit board 34 using an SMT process, which is a standard process in the industry. Solder paste is dispensed on the contact locations on the rigid circuit board 34 before placement of the capacitors 28 and the drivers 29. The contact locations are not shown here, but include the contact pads for all the capacitors 28, the drivers 29, and the contacts near the opening 25 for the MEMS actuator 17. The rigid circuit board 34 with components goes through a reflow soldering oven for soldering. After this process, the part goes through a standard cleaning process to remove any residuals.

Figure 12:
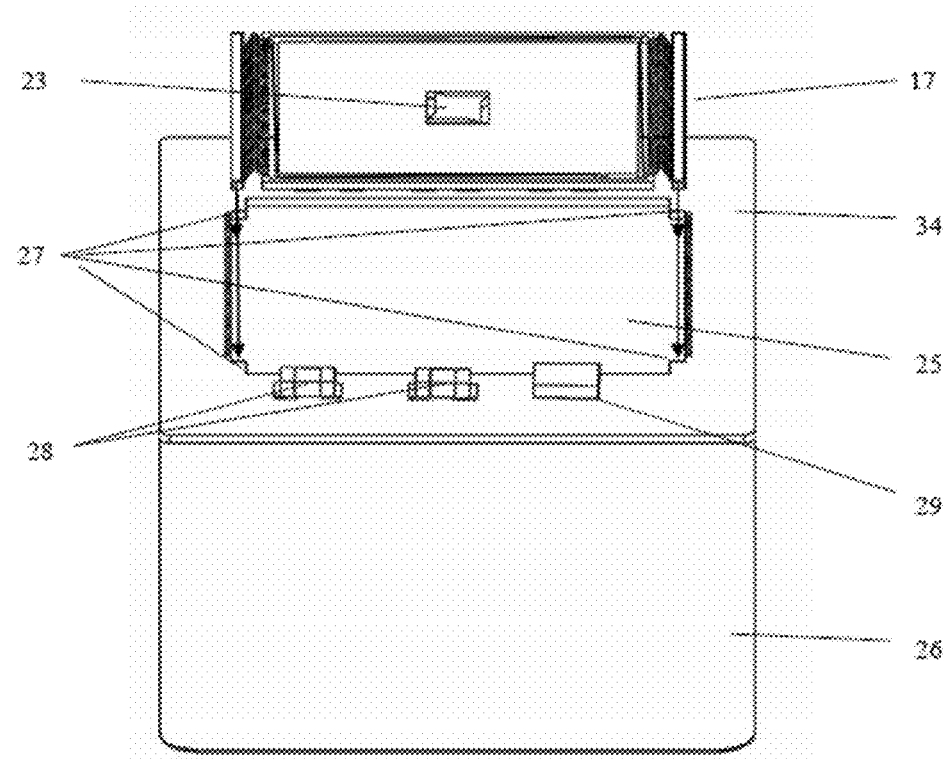

FIG. 12 shows an exploded perspective view of an example embodiment of placement of a MEMS actuator to the rigid circuit board in accordance with the technology disclosed herein. In various embodiments, the gap between the MEMS actuator 17 and the back plate 26 can be controlled by a section of embedded copper under the central anchor 23 of the MEMS actuator. In various embodiments, the central anchor 23 is not limited to the center location, and the central anchor 23 may be located at a different location. In other embodiments, multiple central anchors 23 may be used and positioned at multiple locations on the MEMS actuator. The location or locations of the embedded copper may also change accordingly. In various embodiments, the epoxy between the rigid circuit board 34 and the back plate 26 can flow to the edges of the opening 25 during reflow and this bond line functions to control the gap. A pick and place machine (PnP) can place the MEMS actuator 17 into the rigid circuit board opening 25 using alignment marks on the rigid circuit board 34. U.S. Provisional Patent Application No. 61/989,457 by Liu et al., entitled "Low Stiffness Flexure" and hereby incorporated herein by reference in its entirety, teaches a design and method for flexures that need to be buckled during assembly. If such flexures are used, this pick-and-place tool head may be designed to compress the electrical connection flexures 22 to the buckled position while assembling. After placement of the MEMS actuator 17, the rigid circuit board 34 with all components once again goes through a reflow soldering oven. Since the solder balls for the MEMS actuator connection already went through reflow and cleaning process, the second SMT process for attaching the MEMS actuator 17 should generate significantly less residue. If needed, the assembly can go through an additional cleaning step, provided the MEMS actuator is able to go through such a process without damage.

Figure 13A:
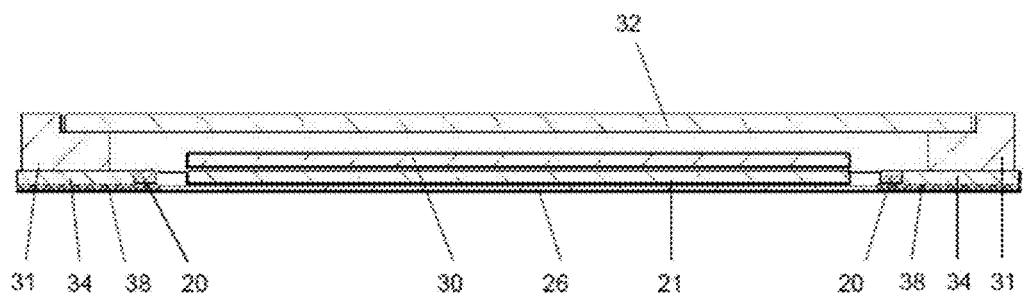
FIG. 13A is a cross-section view of an example embodiment of an image sensor package in accordance with the technology disclosed herein.
Figure 13B:
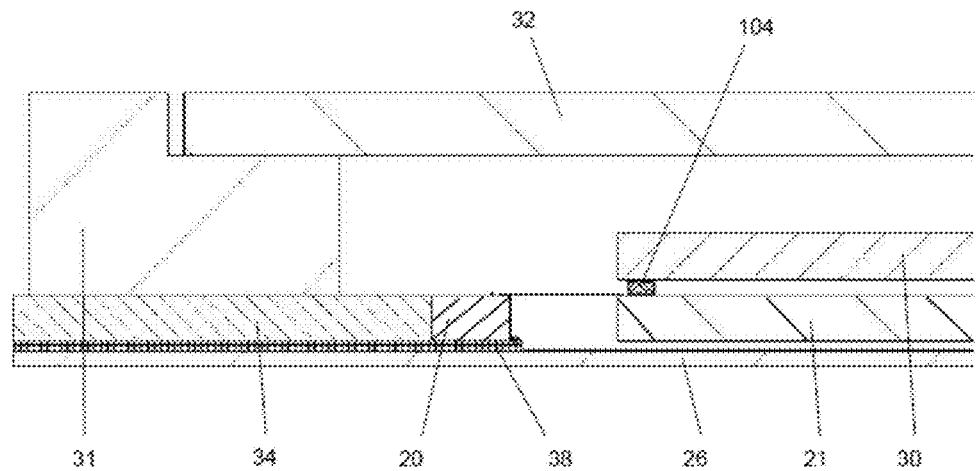
FIG. 13B is a zoomed-in, cross-section view of an example embodiment of an image sensor package in accordance with the technology disclosed herein.

In various embodiments, the back plate 26 and the various layers of the rigid board 34 are assembled together using epoxy, and the glass transition temperature of the epoxy is low enough to create epoxy flow during the reflow process. FIGS. 13A and 13B show cross-sectional views of a moving image sensor package including an epoxy flow. During the second solder reflow, the bonding epoxy 38 between the rigid circuit board 34 and the back plate 26 may flow beyond the edge of the rigid circuit board opening and form a mechanical bond between the MEMS actuator frame bar 20 and the back plate 26. The MEMS actuator may be designed to ensure that there is a sufficient gap between the MEMS actuator moving portion 21 and the MEMS actuator frame bars 20, such that the epoxy flow will not reach the MEMS actuator moving portion 21 and render to moving image sensor package unusable. In various embodiments, the gab may be 300 micrometers long by 150 micrometers tall.

Figure 14:
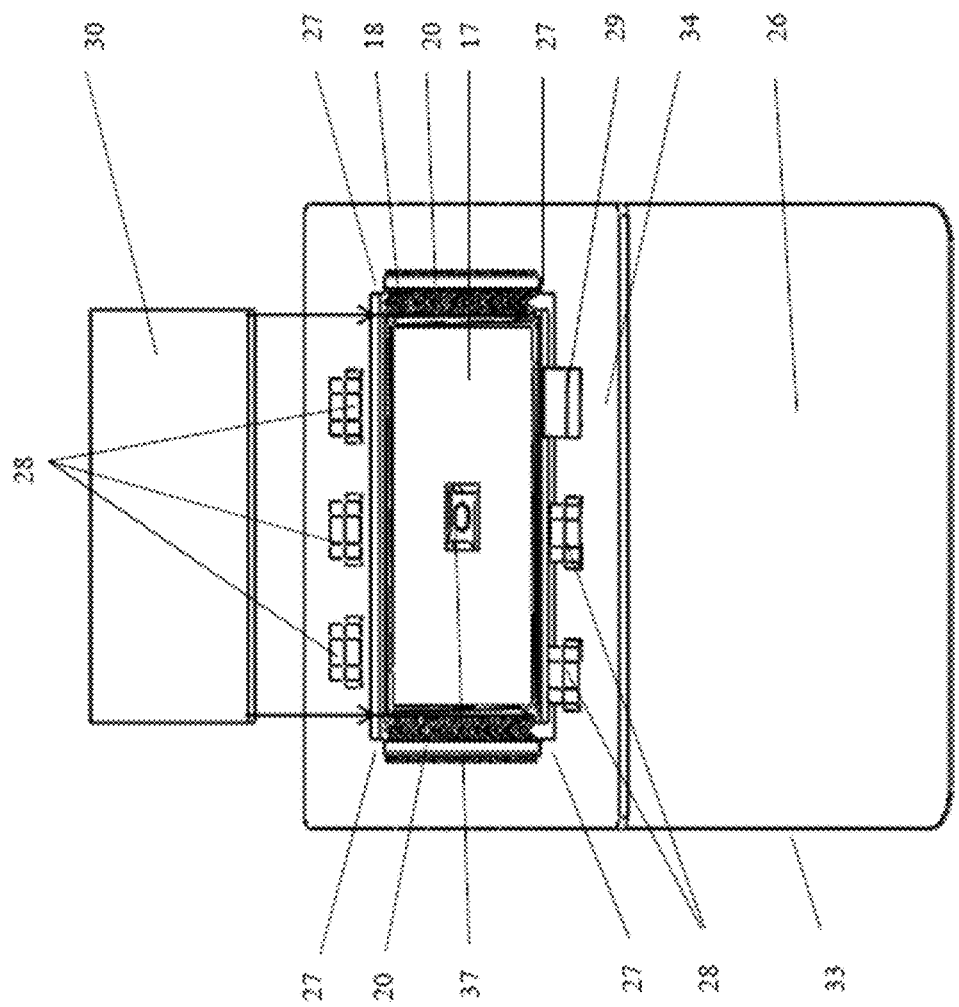
FIGS. 14-16 are exploded perspective views illustrating an example assembly process in accordance with the technology disclosed herein.

FIG. 14 shows an exploded perspective view of mounting the image sensor 30 to the MEMS actuator 17 in accordance with an example embodiment of the technology disclosed herein. When using the SMT process, before the image sensor 30 is placed, solder balls, conductive epoxy, or gold nano inks will be applied to the contact pads of the MEMS actuator middle frame 18. A PnP machine will place the image sensor 30 on the MEMS actuator 17 using alignment marks on the rigid circuit board or chip, and then the parts will go through a low temperature 100 C to 140 C curing process. This process will use a flip-chip style image sensor 30, which has electrical contacts on the bottom side facing the MEMS actuator. As discussed above, the XY dimensions of the MEMS actuator middle frame 18 may be designed to substantially match the X/Y dimensions of the image sensor 30, and the number of pads on the MEMS actuator middle frame may also substantially match the number of pads on the image sensor.

Figure 15:
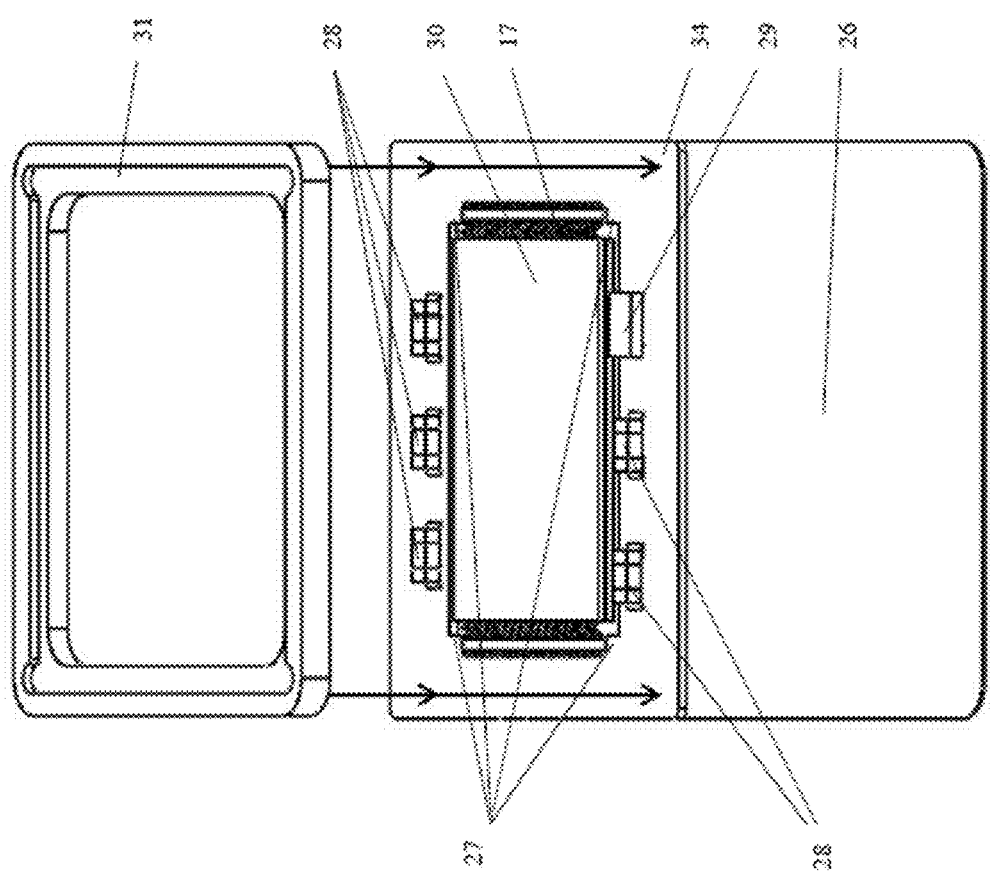

FIG. 15 shows an exploded perspective view of mounting the image sensor cap to the rigid circuit board in accordance with an example embodiment of the technology disclosed herein. In various embodiments, structural epoxy is applied to the bonding area of the rigid circuit board 34, and then a PnP machine places the image sensor cap 31 on the rigid circuit board 34 using alignment marks on the rigid circuit board 34. After this, the entire assembly undergoes a thermal curing process. The image sensor cap may be different shape than what is shown based on the requirement from the adjacent parts and the assembly process. The size and shape of the image sensor cap 31 is defined by the sizes of the image sensor 30, the passive electrical components 28, and the drivers 29. The image sensor cap 31 may also be designed with an irregular shape to allow components in the lens barrel to electrically connect to the rigid circuit board or to accommodate other camera designs.

Figure 16:
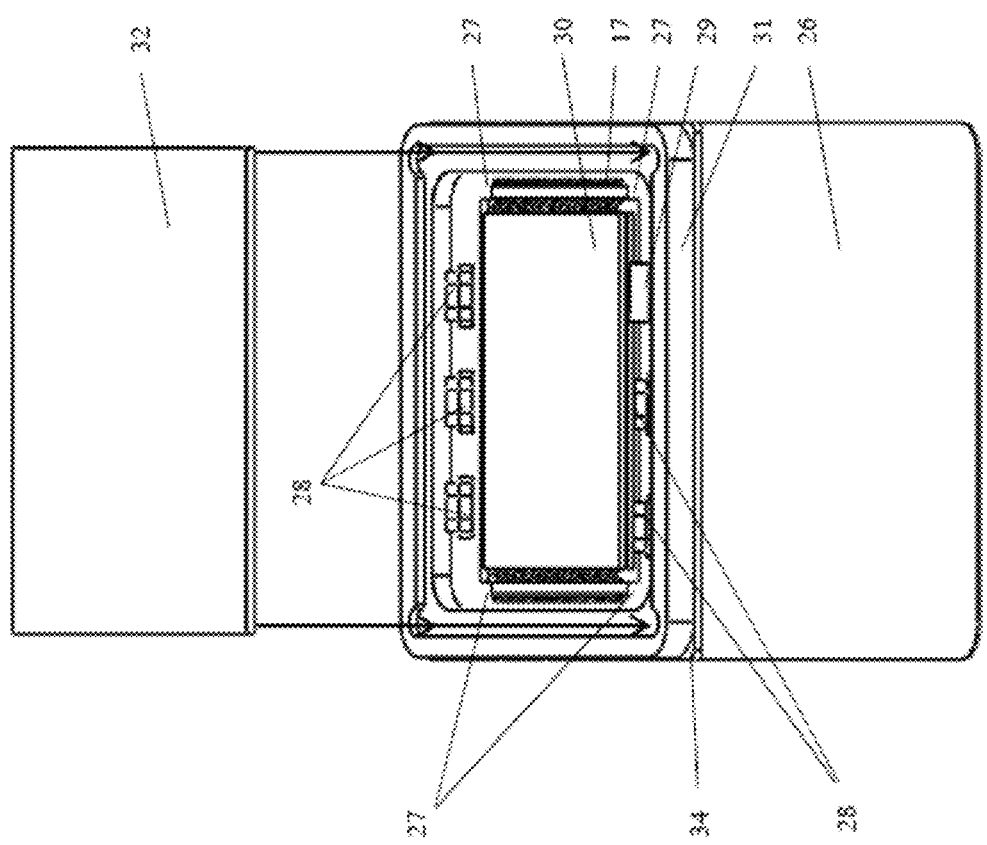

Now referring to FIG. 16, which shows an exploded perspective view of mounting a window to image sensor cap in accordance with an example embodiment the technology disclosed herein, structural epoxy is applied on the bonding area on the image sensor cap, then a PnP machine places the window 32 on the image sensor cap 31 using alignment marks on the image sensor cap 31. After this, the entire assembly may undergo a curing process, which also seals the image sensor and MEMS actuator package. In some embodiments, an IR cut filter may be included in the window, to provide protection of the image sensor from infrared light.

Figure 17:
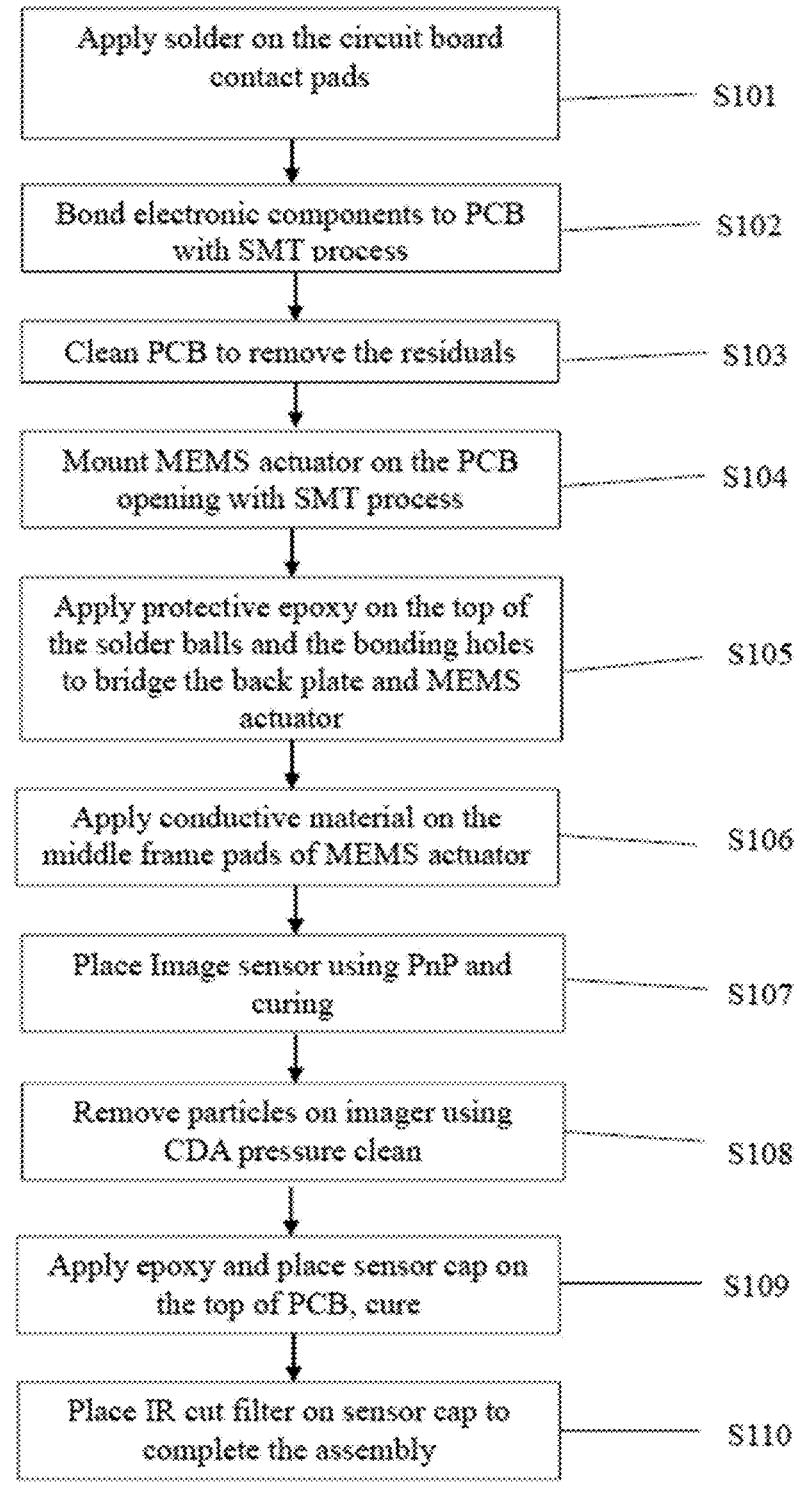
FIG. 17 is an assembly flowchart of an example method of packaging an image sensor in accordance with the technology disclosed herein.

FIG. 17 shows an assembly flow chart for an example method of packaging a moving image sensor in accordance with an example embodiment of the technology disclosed herein. In S101, solder is applied on the contact pads to attach the passive electrical components (such as capacitors and resistors), drivers, the MEMS actuator, and any other integrated circuit chips or other electrical components. Solder is usually applied as a solder paste. In S102, the electronic components are placed on the circuit board and soldered to the electrical contacts using a SMT reflow process. In S103, the rigid circuit board is cleaned to remove residuals arising from the SMT process. In S104, the MEMS actuator is placed and connected to the rigid circuit board by reflowing the solder using an SMT process. If the MEMS actuator can withstand a cleaning process, an additional cleaning step may follow (not shown in the figure). In S105, structural epoxy is applied on top of the solder balls to mechanically reinforce the MEMS actuator connections, and also on the glue holes to mechanically bond the MEMS actuator fixed portion to the back plate. In S106, conductive material that can cure at a temperature between 100 C and 140 C, such as solder, conductive epoxy, or nano ink, is applied to the contact pads on the MEMS actuator middle frame. In step S107, the image sensor is aligned and placed on the MEMS actuator using a PnP machine and thermally bonded at a temperature between 100 C and 140 C. In S108, particles are removed from the image sensor using CDA pressure cleaning. In S109, structural epoxy is applied and the image sensor cap is placed on the rigid circuit board and cured. In S110, structural epoxy is applied and the window is placed on the image sensor cap to complete the assembly and seal the package.

Although the moving image sensor package has been described above in regards to one example manufacturing process, other manufacturing processes are contemplated by the present disclosure. In various embodiments, the moving image sensor package may be manufactured without the use of an epoxy capable of epoxy flow. In such embodiments, the gap between the MEMS actuator moving portion 21 and the MEMS actuator frame bars 20 may be decreased to allow for a smaller total size of the moving image sensor package.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An image sensor package, comprising:
   an image sensor;
   a circuit board having a cutout;
   a MEMS actuator having substantially the same thickness as the circuit board and configured to fit within the cutout;
   a back plate; and
   a cap comprising a window, wherein the back plate and MEMS actuator are configured with a gap formed between the back plate and a moving portion of the MEMS actuator, wherein the gap is less than 50 micrometers.

2. The image sensor package of claim 1, wherein the image sensor is mounted on a moving portion of the MEMS actuator.

3. The image sensor package of claim 2, wherein a shock absorbent bonding material is used to mount the image sensor on the moving portion of the MEMS actuator.

4. The image sensor package of claim 1, wherein the MEMS actuator and the image sensor are encapsulated by the circuit board and the cap.

5. The image sensor package of claim 1, wherein the cap further comprises an infrared cut filter.

6. The image sensor package of claim 1, wherein the image sensor is electrically connected to the MEMS actuator, and the MEMS actuator is electrically connected to the circuit board.

7. The image sensor package of claim 1, wherein the MEMS actuator moves in a rotational degree of freedom and a linear degree of freedom.

8. The image sensor package of claim 1, wherein the cap further comprises motion limiting components designed to limit the motion of the image sensor.

9. The image sensor package of claim 1, wherein a fixed portion of the MEMS actuator is attached to the back plate.

10. A camera in a portable electronic device, comprising:
    an image sensor;
    a MEMS actuator for moving the image sensor;
    a circuit board; and
    a back plate and a cap that are configured to attach onto the circuit board and encapsulate the MEMS actuator and the image sensor, wherein the back plate and MEMS actuator are configured with a gap formed between the back plate and a moving portion of the MEMS actuator, wherein the gap is less than 50 micrometers.

11. The camera of claim 10, wherein the circuit board has an opening and the MEMS actuator is mounted substantially inside the opening.

12. The camera of claim 10, wherein the MEMS actuator forms an electrical contact to the circuit board; and the image sensor forms an electrical contact to the MEMS actuator.

13. The camera of claim 10, wherein the cap further comprises motion limiting components designed to limit the motion of the image sensor.

14. The camera of claim 10, wherein the MEMS actuator moves in a rotational degree of freedom.

15. The camera of claim 10, wherein the MEMS actuator moves in a linear degree of freedom.

16. A method of packaging an image sensor, comprising:
    providing a circuit board with a cutout;
    attaching a MEMS actuator such that it fits substantially within the cutout of the circuit board;
    attaching an image sensor onto a moving portion of the MEMS actuator;
    attaching a back plate onto the circuit board; and
    forming a gap between the back plate and the moving portion of the MEMS actuator, wherein the gap is less than 50 micrometers.

17. The method of claim 16, further comprising:
    providing a cap with a window; and
    encapsulating the MEMS actuator and the image sensor by bonding the cap onto the circuit board.

18. The method of claim 16, further comprising:
    electrically connecting the MEMS actuator to the circuit board; and
    electrically connecting the image sensor to the MEMS actuator.

19. The method of claim 18, wherein the electrical connection is made through one or more of conductive epoxy, wire bonding, or solder bridges.

* * * * *